United States Patent
Le Gouil et al.

(10) Patent No.: US 8,598,040 B2
(45) Date of Patent: Dec. 3, 2013

(54) ETCH PROCESS FOR 3D FLASH STRUCTURES

(75) Inventors: Anne Le Gouil, Fremont, CA (US); Jeffrey R. Lindain, Tracy, CA (US); Yasushi Ishikawa, Fremont, CA (US); Yoko Yamaguchi-Adams, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 2 days.

(21) Appl. No.: 13/226,087

(22) Filed: Sep. 6, 2011

(65) Prior Publication Data

US 2013/0059450 A1  Mar. 7, 2013

(51) Int. Cl.
*H01L 21/3065* (2006.01)
*H01L 21/461* (2006.01)
*H01L 21/302* (2006.01)
*H01L 21/3213* (2006.01)
*H01L 21/306* (2006.01)
*H01L 21/311* (2006.01)
*H01L 27/115* (2006.01)

(52) U.S. Cl.
CPC ..... *H01L 21/32137* (2013.01); *H01L 21/32135* (2013.01); *H01L 21/32136* (2013.01); *H01L 21/30621* (2013.01); *H01L 21/3065* (2013.01); *H01L 21/31116* (2013.01); *H01L 27/115* (2013.01); *H01L 27/11551* (2013.01)
USPC .......... 438/714; 438/706; 438/710; 438/715; 438/719; 438/723; 438/733; 216/58; 216/63; 216/67; 216/68; 216/74; 216/79; 257/E21.218; 257/E21.312; 257/E21.577; 257/E21.252

(58) Field of Classification Search
CPC ............... H01L 21/32137; H01L 21/3065; H01L 21/32135; H01L 21/32136; H01L 21/30621; H01L 21/3116; H01L 27/115; H01L 27/11551
USPC ......... 438/706, 710, 714, 715, 719, 723, 733; 216/58, 63, 67, 68, 74, 79; 257/E21.218, E21.312, E21.577, 257/E21.252
See application file for complete search history.

(56) References Cited

U.S. PATENT DOCUMENTS 5,827,437 A * 10/1998 Yang et al. .................. 216/77
6,127,278 A * 10/2000 Wang et al. ............... 438/719
(Continued)

OTHER PUBLICATIONS

Min et al., "Dependence of bottom and sidewall etch rates on bias voltage and source power during the etching of poly-Si and fluorocarbon polymer using SF6, C4F8, and O2 plasmas," J. Vac. Sci. Technol. B, vol. 22, Issue 3, May 2004, pp. 893-901.

(Continued)

*Primary Examiner* — Lan Vinh
*Assistant Examiner* — David Kaufman
(74) *Attorney, Agent, or Firm* — Beyer Law Group LLP

(57) ABSTRACT

A method for etching features in a plurality of silicon based bilayers forming a stack on a wafer in a plasma processing chamber is provided. A main etch gas is flowed into the plasma processing chamber. The main etch gas is formed into a plasma, while providing a first pressure. A wafer temperature of less than 20° C. is maintained. The pressure is ramped to a second pressure less than the first pressure as the plasma etches through a plurality of the plurality of silicon based bilayers. The flow of the main etch gas is stopped after a first plurality of the plurality of bilayers is etched.

15 Claims, 7 Drawing Sheets

(56) References Cited

U.S. PATENT DOCUMENTS

| | | | |
|---|---|---|---|
| 6,303,513 B1* | 10/2001 | Khan et al. | 438/714 |
| 7,459,100 B2* | 12/2008 | Kiermasz et al. | 216/67 |
| 2005/0164514 A1* | 7/2005 | Rauf et al. | 438/710 |
| 2008/0057724 A1* | 3/2008 | Kiehlbauch et al. | 438/706 |
| 2008/0067583 A1* | 3/2008 | Kidoh et al. | 257/326 |
| 2008/0305644 A1* | 12/2008 | Noda et al. | 438/733 |
| 2009/0191711 A1* | 7/2009 | Rui et al. | 438/695 |
| 2010/0297849 A1* | 11/2010 | Miyake et al. | 438/710 |
| 2012/0028376 A1* | 2/2012 | Radwan et al. | 438/5 |

OTHER PUBLICATIONS

Hideaki Aochi; "BiCS Flash as a Future 3D Non-volatile Memory Technology for Ultra High Density Storage Devices," 2009 IEEE Memory Workshop; 2 pages.

* cited by examiner

ETCH PROCESS FOR 3D FLASH STRUCTURES

BACKGROUND OF THE INVENTION

The present invention relates to the formation of semiconductor devices. More specifically, the invention relates to the formation of three dimensional flash structure semiconductor devices.

During semiconductor wafer processing, high aspect ratio vias are sometimes required. For example, in three dimensional flash memory devices, vias are formed in a stack of a plurality of bilayers. An example of such a device is the Toshiba BiCS (Bit Cost Scalable).

SUMMARY OF THE INVENTION

To achieve the foregoing and in accordance with the purpose of the present invention, a method for etching features in a plurality of silicon based bilayers forming a stack on a wafer in a plasma processing chamber is provided. A main etch gas is flowed into the plasma processing chamber. The main etch gas is formed into a plasma, while providing a first pressure. A wafer temperature of less than 20° C. is maintained. The pressure is ramped to a second pressure less than the first pressure as the plasma etches through a plurality of the plurality of silicon based bilayers. The flow of the main etch gas is stopped after a first plurality of the plurality of bilayers is etched.

In another manifestation of the invention a method for etching features in a plurality of silicon based bilayers forming a stack on a wafer in a plasma processing chamber is provided. A main etch gas comprising a fluorocarbon and $NF_3$ is flowed into the plasma processing chamber. The main etch gas is formed into a plasma, while providing a first pressure between 30 mtorr to 60 mtorr. A wafer temperature of less than 10° C. is maintained. The pressure is ramped to a second pressure less than the first pressure as the plasma etches through a plurality of the plurality of silicon based bilayers. The flow of the main etch gas is stopped after a first plurality of the plurality of bilayers is etched.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Etching high aspect ratio holes requires sidewall protection to ensure CD control and avoid bowed and undercut profiles. However, too much polymer would lead to pinch off profiles and etch stop. At high aspect ratio, the amount of reactive species reaching the etch surface is significantly decreased due to the narrow view angle. Ions are more likely to lose their energy by collision with etch by-products or etchants inside the holes or with the hole sidewalls slowing down the etch rate. This is called Aspect Ratio Dependent Etching (ARDE). Increasing ion energy can help maintain the directionality of ions and avoid too much loss on sidewalls, but the trade off is mask selectivity. Increasing TCP also provides more etchant species, ions, and neutrals. However, increasing TCP does not systematically increase the etch rate, because the etch rate is limited by reactant diffusion down the holes.

Figure 1:
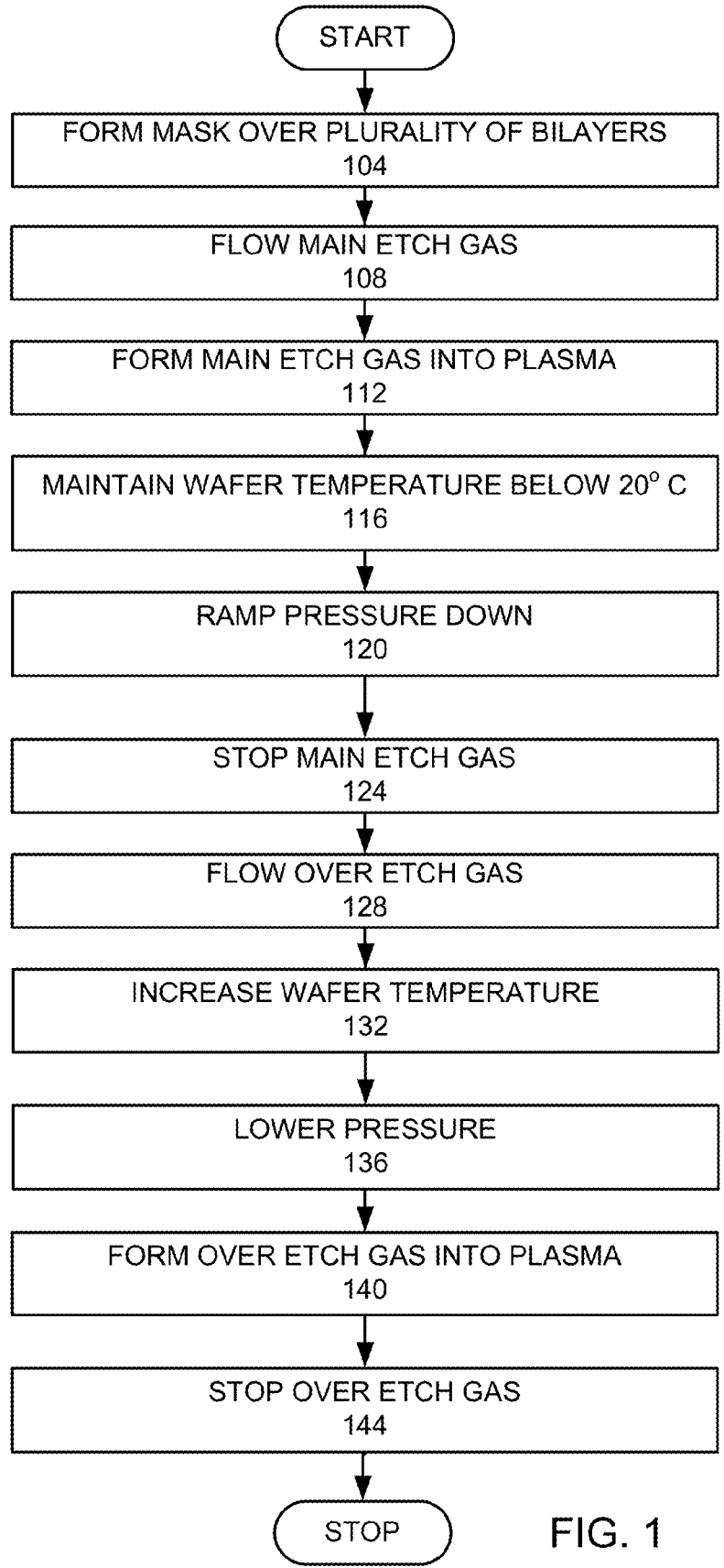
FIG. 1 is a high level flow chart of a process that may be used in an embodiment of the invention.

To facilitate understanding, FIG. 1 is a high level flow chart of a process that may be used in an embodiment of the invention, which forms high aspect ratio vias in a stack of silicon based bilayers. A mask is formed over a stack of a plurality of silicon based bilayers on a wafer (step 104). A main etch process is begun by flowing a main etch gas into a plasma processing chamber into which the wafer has been placed (step 108). The main etch gas is formed into a plasma at a first pressure (step 112). The wafer is maintained at a temperature below 20° C. (step 116). The pressure is ramped down to a second pressure less than the first pressure as some of the plurality of bilayers is etched (step 120). The flow of the main etch gas is stopped (step 124). An over etch process may then be provided by flowing an over etch gas into the plasma processing chamber (step 128). The over etch gas is more polymerizing than the main etch gas. The wafer temperature is increased (step 132). The chamber pressure is decreased (step 136). The plasma is formed from the over etch gas (step 140) which completes the etching of the plurality of bilayers. The over etch gas is stopped (step 144).

Example

Figure 2A:
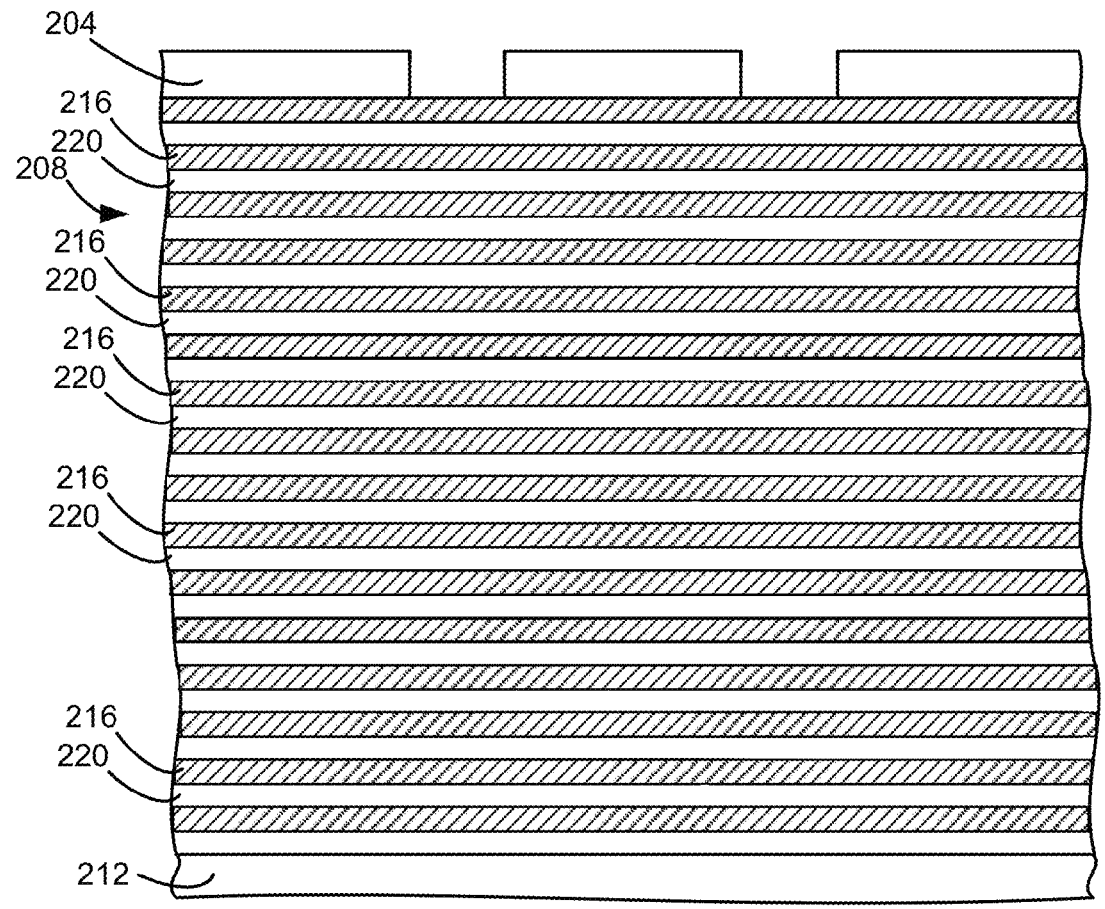
FIGS. 2A-C are schematic cross-sectional views of a memory stack formed according to an embodiment of the invention.

In an example of an implementation of the invention, high aspect ratio vias are etched in a plurality of silicon based bilayers forming a stack over a wafer substrate. Each bilayer preferably has a thickness of 20 to 40 nm. A mask is formed over the plurality of bilayers (step 104). FIG. 2A is a cross sectional view of a mask 204 formed over a plurality of bilayers creating a memory stack 208 on the wafer 212. In this embodiment, each bilayer of the plurality of bilayers is formed by a layer of silicon oxide (SiO) 216 under a layer of polysilicon 220. In this embodiment, the mask 204 is amorphous carbon. One or more layers such as an etch stop layer may be disposed between the stack 208 and the wafer 212, or the wafer 212 may be used as the landing layer. One or more layers may be disposed between the memory stack 208 and the mask 204.

Figure 3:
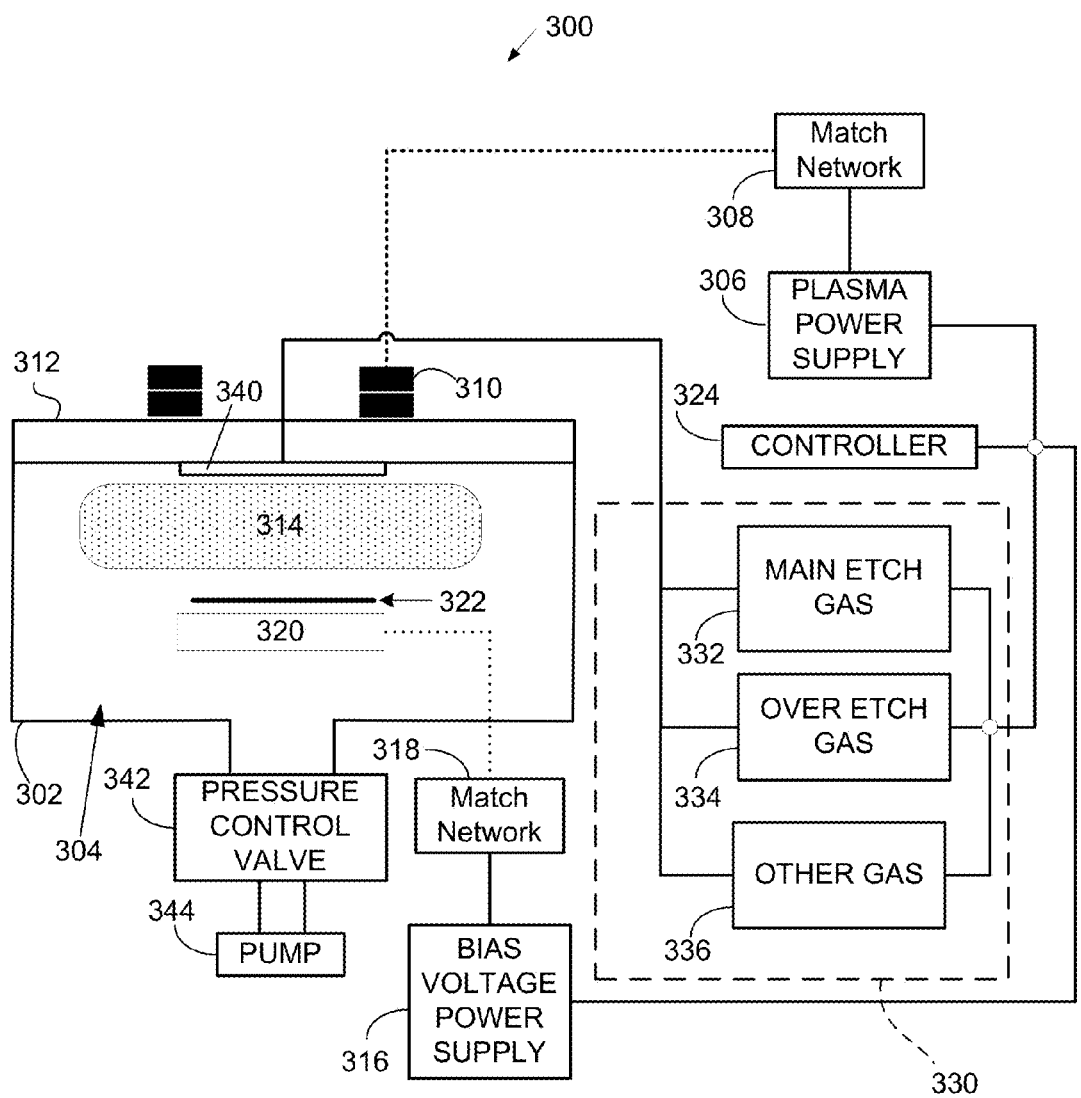
FIG. 3 is a schematic view of a plasma processing chamber that may be used in practicing the invention.

The wafer 212 may be placed in a processing tool to perform subsequent steps. FIG. 3 schematically illustrates an example of a plasma processing system 300 which may be used to perform the process of etching silicon wafers in accordance with one embodiment of the present invention. The plasma processing system 300 includes a plasma reactor 302 having a plasma processing chamber 304 therein. A plasma power supply 306, tuned by a match network 308, supplies power to a TCP coil 310 located near a power window 312 to create a plasma 314 in the plasma processing chamber 304 by providing an inductively coupled power. The TCP coil (upper power source) 310 may be configured to produce a uniform diffusion profile within processing chamber 304. For example, the TCP coil 310 may be configured to generate a toroidal power distribution in the plasma 314. The power window 312 is provided to separate the TCP coil 310 from the plasma chamber 304 while allowing energy to pass from the TCP coil 310 to the plasma chamber 304. A wafer bias voltage power supply 316 tuned by a match network 318 provides power to an electrode 320 to set the bias voltage on a wafer 322 which is supported by the electrode 320. A controller 324 sets points for the plasma power supply 306 and the wafer bias voltage supply 316.

The plasma power supply 306 and the wafer bias voltage power supply 316 may be configured to operate at specific radio frequencies such as, for example, 13.56 MHz, 27 MHz, 2 MHz, 400 kHz, or combinations thereof. Plasma power supply 306 and wafer bias power supply 316 may be appropriately sized to supply a range of powers in order to achieve desired process performance. For example, in one embodiment of the present invention, the plasma power supply 306 may supply the power in a range of 300 to 10000 Watts, and the wafer bias voltage power supply 316 may supply a bias voltage of in a range of 10 to 1000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source includes a main etch gas source 332, an over etch gas source 334, and optionally, an additional gas source 336. The main etch gas may have some of the same components as the over etch gas. In such a case, instead of having a separate main etch gas source and over etch gas source, the gas source provides various components of the main etch gas and over etch gas, as will be described below. The gas sources 332, 334, and 336 are in fluid connection with processing chamber 304 through a gas inlet, such as a shower head 340. The gas inlet may be located in any advantageous location in chamber 304, and may take any form for injecting gas. Preferably, however, the gas inlet may be configured to produce a "tunable" gas injection profile, which allows independent adjustment of the respective flow of the gases to multiple zones in the process chamber 304. The process gases and byproducts are removed from the chamber 304 via a pressure control valve 342 and a pump 344, which also serve to maintain a particular pressure within the plasma processing chamber 304. The gas source/gas supply mechanism 330 is controlled by the controller 324. A Kiyo by Lam Research Corp. may be used to practice an embodiment of the invention. Preferably the chamber has an aluminum oxide coated surface with ACME (Yt coat) coating.

Figure 4:
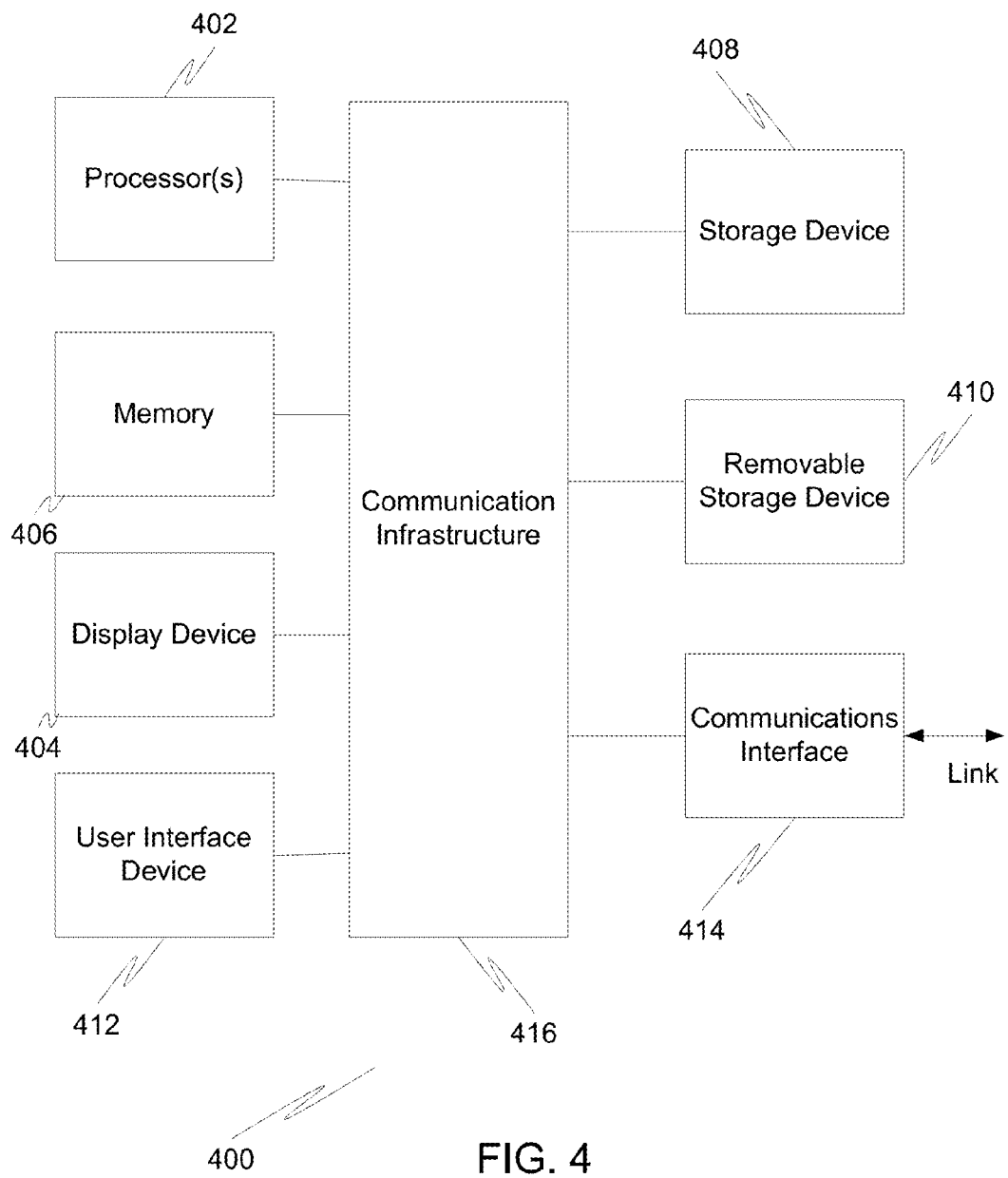
FIG. 4 illustrates a computer system, which is suitable for implementing a controller used in embodiments of the present invention.

FIG. 4 is a high level block diagram showing a computer system 400, which is suitable for implementing a controller 324 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

The features are etched into the silicon based bilayers, using a main etch. In this example, the features are vias that are etched into the silicon oxide and polysilicon bilayers. A main etch gas is flowed from the gas source 330 into the plasma processing chamber 304 (step 108). In this example the flow of the main etch gas is 20-100 sccm $CH_2F_2$, 50-300 sccm $N_2$, and 1-200 sccm $NF_3$. Preferably, the main etch gas comprises a fluorocarbon gas and $NF_3$. More preferably the fluorocarbon gas is a hydrofluorocarbon gas. The main etch gas is formed into a plasma (step 112). In this example, 1,000-2,000 watts at 13.6 MHz of RF power are provided by the TCP coil 310. A bias of 100-700 volts at 400 kHz is provided by the lower electrode 320. The chamber pressure is set at 40 mtorr. The wafer temperature is maintained below 20° C. (step 116). In this example, the wafer temperature is maintained at 0° C.

The pressure is ramped down (step 120). In this example, the pressure is ramped down from 40 mtorr to 10 mtorr. For a 16 bilayer stack, preferably, at least 4 different pressures are provided during the pressure ramp down. More preferably, at least 6 different pressures are provided during the pressure ramp down. Most preferably, the ramp down is a continuous ramp down. In this example the pressure endpoints of 40 mtorr and 10 mtorr are provided. A linear or hyperbolic ramp between the endpoints is provided to provide the at least 6 different main etch pressures during the ramp down. The flow of the main etch gas is stopped (step 124).

Figure 2B:
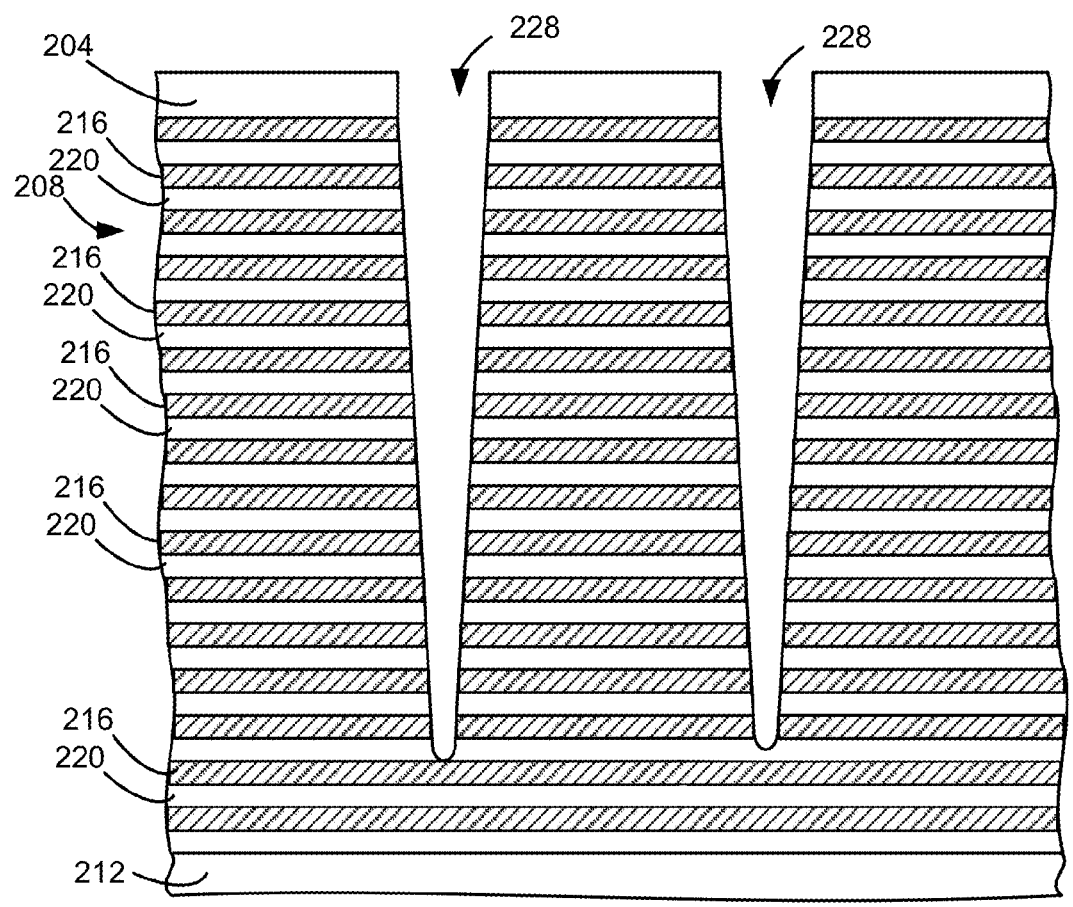

FIG. 2B is a cross-sectional view of the stack, after a plurality of bilayers are etched using a single main etch step to form etch features 228. In this example, the main etch provides a tapered profile and etches through twelve of the sixteen bilayers. In this example, the main etch is used to etch through almost all of the bilayers, because the main etch provides a fast etch, even though the resulting profile is tapered. The main reason that the main etch is not used to etch through all of the bilayers is because of the low selectivity between etching the bilayers and etching the underlying layer. If all of the bilayers were etched by the main etch, the low selectivity may cause the underlying layer, which is wafer 212, to be etched. FIG. 2B shows that one etch feature is deeper than the other. Another reason for not using the main etch to etch all of the bilayers, is so that the uneven etching of the main etch does not cause the underlying layer, which is wafer 212, to be etched.

In this example, an over etch is used to complete the etch features. The over etch flows an over etch gas different from the main etch gas into the plasma processing chamber (step 128). Generally, the over etch gas is more polymerizing than the main etch gas. This is achieved by providing a higher concentration of carbon component. In an example recipe, the flow of the over etch gas comprises 0-100 sccm $CH_2F_2$, 1-200 sccm $NF_3$, 0-100 sccm $CH_3F$, and 0-100 sccm $CH_4$.

The wafer temperature is increased (step 132). In this example, the wafer temperature is increased to 20° C. The chamber pressure is lowered (step 136). In this example, the chamber pressure is reduced to 5 mtorr. The over etch gas is formed into a plasma (step 140). In this example, 1,000-2,000 watts at 13.6 MHz of RF power are provided by the TCP coil 310. A bias of 100-700 volts at 400 kHz is provided by the lower electrode 320. The flow of the over etch gas is stopped (step 144).

Figure 2C:
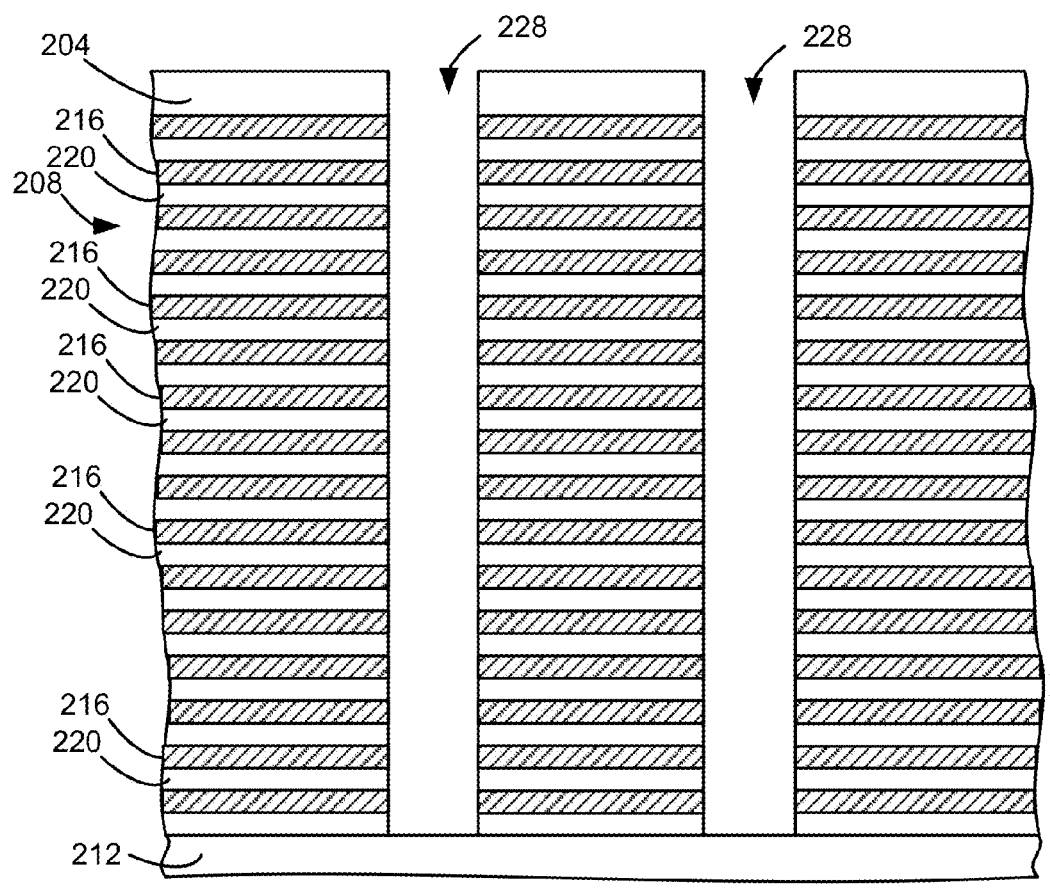

FIG. 2C is a cross-sectional view of the stack, after the over etch is completed. The over etch is used to etch through the remaining bi-layers to complete the etch features, to land in the underlying layer, which is wafer 212, and to widen the tapered bottoms of the etch features without widening the tops of the etch features. This provides a more uniform etch feature from top to bottom.

It has been found that ramping down the pressure reduces aspect ratio dependent etching, which prevents etch stop, and eliminates or reduces a need to ramp up the bias during the etch, which prevents the reduction of etch mask selectivity. Preferably, the bias is constant during the etch.

Figure 5:
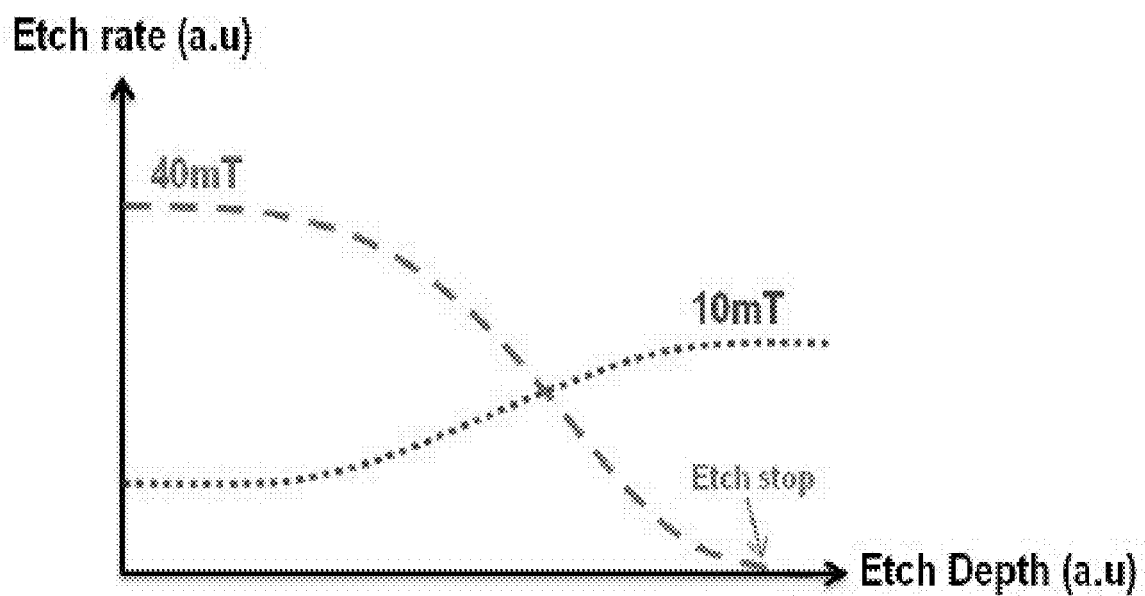
FIG. 5 is a graph of etch rate versus etch depth for two different pressures.

FIG. 5 is a graph of etch rate on the vertical axis versus etch depth on the horizontal axis for 40 mtorr and for 10 mtorr found by experiment. The results show the impact of pressure and aspect ratio on etch rate. At high pressure and low aspect ratio, the hole etch rate is fast. It was found that at high pressure, as aspect ratio increases, the etch rate slows down, eventually reaching zero. The experiment found that at low pressure and low aspect ratio, the etch is slow. As aspect ratio increases, the low pressure etch rate increases before it becomes saturated. The lower pressure increases the mean free path. The invention takes advantage of the faster high pressure low aspect ratio etch rate and the faster low pressure high aspect ratio etch rate, by using a ramping that eliminates aspect ratio dependent etch rates.

The ramp down of the pressure may be a continuous function, such as a linear ramp or may be done in a step wise manner. Preferably, the ramping occurs over most of the main etching period. For example, if twelve sets of bilayers are etched, the ramping preferably occurs during the etching of at least six sets of bilayers. If the ramping is step wise, preferably there are at least half as many steps in the ramp as there are sets of bilayers. For example, if twelve sets of bilayers are etched, then at least six different pressures are provided during the ramp down process. Preferably, the main etch pressure starts at a pressure between 30 to 60 mtorr, which provides a high initial etching speed. The pressure may be ramped down to as low as 2 mtorr.

Although the etch features may be trenches or vias, since the invention provides high aspect ratio etching, preferably the etch features are vias. Preferably, the vias have a width no greater than 80 nm. More preferably, the vias have a width of between 20 to 80 nm. Even more preferably, the vias have a width of between 45 to 60 nm. Via depths are preferably greater than 1.4 microns. Preferably the aspect ratio of the depth of the vias to the width of the vias is at least 20:1. More preferably, the aspect ratio is at least 35:1.

Although the above example has sixteen pairs of bilayers, other embodiments of the invention may have more than sixteen pairs of bilayer, such as thirty-two or sixty-four pairs of bilayers.

Preferably, the wafer temperature during the main etch is no more than 20° C. More preferably, the wafer temperature during the main etch is no more than 10° C.

$NF_3$ is able to etch both polysilicon and silicon oxide. The fluorocarbon, which preferably is $CH_2F_2$ forms a polymer, which by itself would cause etch stop. Good control of etch versus deposition is provided by adjusting the $NF_3/CH_2F_2$ gas ratio. The $CH_2F_2$ is used to provide $CF_2$, which is used to etch silicon oxide. It has been found that providing a wafer temperature of no more than 20° C. and more preferably no more than 10° C., causes more $CF_2$ to reach and form on the silicon oxide by increasing the sticking coefficient, which participates in etching the silicon oxide, thus increasing the etch rate of the silicon oxide. In addition, the etch selectivity is increased. The etch rate of the polysilicon is decreased due to the formation of the same polymer on the surface, but the etch rate remains high enough to maintain etching down the via hole. Preferably the flow rate of $CH_2F_2$ is between 10 sccm and 100 sccm. Preferably the flow rate of $NF_3$ is between 20 sccm and 80 sccm. Preferably, the flow ratio of $NF_3/CH_2F_2$ is between 1:1 to 1:2.

Preferably, the bias during the main etch is provided at a frequency between 100 kHz and 1 MHz. More preferably, the bias is provided at a frequency between 300 kHz to 500 kHz. Most preferably, the bias is provided at a frequency of about 400 kHz. Preferably the bias is kept between 500 volts to 700 volts. The lower frequency bias provides higher energy ions, which has been found to improve the main etch process by limiting the reduction of the CD at the bottom of the vias. In the preferred embodiment, the bias control is provided in voltage mode, so that the as the pressure is ramped down the voltage is kept constant as the power decreases. If the bias control is provided in the power mode, as the pressure ramps down the bias voltage would decrease, which would lower the etch rate.

Preferably, the main etch, in a single etch, etches between half and all of the bilayers. More preferably, the main etch, in a single etch, etches between five eighths and seven eighths of all the bilayers. Most preferably, the main etch, in a single etch, etches about three fourths of the bilayers. The over etch, in a single over etch, etches the remaining bilayers.

The over etch further lowers the pressure to improve etching at the bottoms of the etch features. The lower pressure increases the mean free path, which allows more etchant to travel to the bottoms of the features. If the bottom of the pressure ramp during etching is low enough, then in an embodiment of the invention, the pressure is maintained at the lower pressure, but not further ramped down during the over etch. The lower pressure also helps to avoid the deposition of too much polymer on top of the mask, which would close the via and create etch stop.

In the example recipe for the over etch, the $NF_3/CH_3F$ gas ratio is used to control etch versus deposition and mask selectivity. In addition, $CH_4$ gas is an additional passivant to protect the mask and reduce mask faceting. The amount of deposition is controlled by the fluorine to carbon ratio. The $CH_3F/CH_4$ ratio acts as a knob for controlling deposition quality from $CF_x$, $CH_x$ like polymer to more C-C like carbon rich polymer, which usually has a higher etch resistance. Preferably, the flow ratio of $NF_3/CH_3F$ is between 3:1-1:3.

During the over etch, it is preferred that the wafer temperature is at least 20° C. The higher temperature decreases deposition of polymer at the bottom of the etch features to avoid pinch off profile and etch stop. Without being bound by theory, the over etch chemistry is able to be more polymerizing, since the polymer additive in the over etch chemistry is not used for etching the silicon oxide in the way that $CH_2F_2$ is used to etch silicon oxide during the main etch. Instead, the over etch relies more on fluorine for etching. The polymer additive used in the over etch, instead is mainly to form a protective polymer layer to protect the mask. Because during the over etch, the aspect ratio is high, the polymer does not reach the bottom of the etch features. So more polymer protection is provided at the top of the etch features than at the bottom of the etch features, allowing the bottom of the etch features to be etched and widened without widening the top of the etch features. Previous over etch recipes would use lower polymerizing chemistries at higher pressures.

Preferably, the bias during the over etch is provided at a frequency between 100 kHz and 1 MHz. More preferably, the bias is provided at a frequency between 300 kHz to 500 kHz. Most preferably, the bias is provided at a frequency of about 400 kHz. Preferably the bias is kept between 300 volts to 500 volts. This voltage range is preferred to maintain etching while avoiding too much sputtering of the mask.

During both the main etch and over etch, preferably, the TCP coil 310 provides an RF power of between 1000 watts to 2,500 watts. More preferably, the TCP coil 310 provides an RF power between 1500 watts to 2000 watts. Increasing TCP power helps increase the etch rate until saturation is reached. In this example, saturation was found at 2000 watts TCP. It has also been found that the invention shows little scalloping between the silicon oxide and polysilicon layers in the bilayers. The inventive single step process main etch followed by an over etch to etch at least sixteen bilayers has advantages over a process that provides at least sixteen cycles to etch at least sixteen bilayers where each cycle comprises polysilicon etch step and an oxide etch step. One advantage is that the inventive single step for etching at least sixteen bilayers has a faster throughput, has better tunability, and top profile control.

In other embodiments of the invention, other steps may occur between the main etch step and the over etch step. For example, one or more additional etch steps may occur between the main etch step and the over etch step. Such additional etch steps may be transition steps between the main etch step and over etch step. Such transitional steps may combine characteristics of the main etch step and the over etch step.

In another embodiment of the invention, each bilayer may comprise a silicon oxide layer and a silicon nitride layer. In other embodiment the bilayer may comprise one or more additional layers, so that the bilayers may have three or four layers.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching features in a plurality of silicon based bilayers forming a stack on a wafer in a plasma processing chamber, comprising:
    flowing an oxygen free main etch gas into the plasma processing chamber wherein the main etch gas comprises a hydrofluorocarbon and $NF_3$;
    forming the main etch gas into a plasma, while providing a first pressure between 30 mtorr to 60 mtorr;
    maintaining a wafer temperature of less than 10° C.;
    ramping the pressure to a second pressure less than the first pressure as the plasma etches through a plurality of the plurality of silicon based bilayers; and
    stopping the flow of the main etch gas after a first plurality of the plurality of bilayers is etched.

2. The method, as recited in claim 1, wherein the forming the main etch gas into a plasma comprises providing an inductively coupled power to a upper power source placed on a first side of the wafer and providing a bias power to a bottom electrode on a second side of the wafer opposite the first side of the wafer wherein the bias power has a frequency between 100 kHz and 1 MHz.

3. The method, as recited in claim 1, further comprising an over etch after stopping the flow of the main etch gas for etching remaining unetched bilayers, wherein the over etch comprises:
    flowing an over etch gas which is more polymerizing than the main etch gas and comprising $NF_3$ into the plasma processing chamber;
    forming the over etch gas into a plasma;
    stopping the flow of the over etch gas; and
    wherein the over etch further comprises increasing the wafer temperature from the main etch.

4. The method, as recited in claim 3, wherein the over etch further comprises lowering the pressure from the main etch.

5. The method, as recited in claim 1, wherein each silicon based bilayer comprises a polysilicon layer and a silicon oxide layer.

6. The method, as recited in claim 1, wherein the over etch is performed until an etch stop layer is reached.

7. The method, as recited in claim 1 wherein the bilayers comprise alternating layers of amorphous silicon and silicon oxide or the bilayers comprise alternating layers of silicon nitride and silicon oxide.

8. The method, as recited in claim 1 wherein the over etch gas further comprises $CH_3F$, and $CH_4$ and wherein said over etch includes modulating the quality of a deposited polymer layer by adjusting a $CH_3F$ to $CH_4$ ratio in the over etch gas.

9. A method for etching wafer bilayers in a plasma processing chamber, the method comprising
    arranging a wafer in a plasma processing chamber wherein the wafer includes at least 16 silicon based bilayers including a first plurality of twelve silicon based bilayers;
    flowing a main etch gas into the plasma processing chamber;
    forming the main etch gas into a plasma, while providing a first pressure;
    maintaining a wafer temperature of less than 20° C.;
    ramping the pressure to a second pressure that is less than the first pressure as the plasma etches through the at least 12 silicon based bilayers wherein said ramping provides at least six different pressures over which the 12 bilayers are etched; and stopping the flow of the main etch gas after a first plurality of the plurality of bilayers is etched.

10. The method recited in claim 9, wherein each silicon based bilayer comprises a polysilicon layer and a silicon oxide layer;

the main etch gas comprises a hydrofluorocarbon and $NF_3$; and the plasma is formed by providing an inductively coupled power to a upper power source placed on a first side of the wafer and providing a bias power to a bottom electrode on a second side of the wafer opposite the first side of the wafer, such that the bias power has a frequency between 100 kHz and 1 MHz, and a first pressure between 30 mtorr to 60 mtorr is provided, and the wafer temperature is less than 10° C.

11. The method, as recited in claim 10, wherein the etch features are vias with an aspect ratio of at least 20:1.

12. The method, as recited in claim 11, further comprising an over etch after stopping the flow of the main etch gas for etching remaining unetched bilayers, wherein the over etch comprises:

flowing an over etch gas which is more polymerizing than the main etch gas and comprising $NF_3$ into the plasma processing chamber;

forming the over etch gas into a plasma; and stopping the flow of the over etch gas.

13. The method, as recited in claim 12, wherein the over etch further comprises increasing the wafer temperature from the main etch.

14. The method, as recited in claim 13, wherein the over etch further comprises lowering the pressure from the main etch.

15. The method, as recited in claim 1 wherein the bilayers comprise a polysilicon layer and silicon oxide layer.

* * * * *